(12) United States Patent
Dryer et al.

(10) Patent No.: US 6,187,216 B1
(45) Date of Patent: *Feb. 13, 2001

(54) METHOD FOR ETCHING A DIELECTRIC LAYER OVER A SEMICONDUCTOR SUBSTRATE

(75) Inventors: Paul William Dryer, Gilbert; Michael J. Davison, Mesa; Ralph A. Dyrsten, Phoenix, all of AZ (US)

(73) Assignee: Motorola, Inc., Schaumburg, IL (US)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 33 days.

(21) Appl. No.: 08/917,982

(22) Filed: Aug. 27, 1997

(51) Int. Cl.$^7$ .................................................. C03C 15/02
(52) U.S. Cl. ............................... 216/95; 216/99; 438/756
(58) Field of Search ................................. 216/83, 90, 93, 216/95, 96; 438/745, 747

(56) References Cited

U.S. PATENT DOCUMENTS 5,593,538   1/1997   Davison et al. ..................... 156/637

OTHER PUBLICATIONS

"Tough Under Pressure! Liqui–Cel", AT&T Application Sheet, PC–P41–1/97–HC, 1997 Hoechst Celanese Corporation.

*Primary Examiner*—Randy Gulakowski
*Assistant Examiner*—Allan Olsen
(74) *Attorney, Agent, or Firm*—Lanny L. Parker

(57) ABSTRACT

A wet etch bath (61) holds a wet etchant (52) for etching a dielectric over a semiconductor substrate. The wet etch bath (61) has a tub (63) separated from a reservoir (64) by a wall (65). The tub (63) is filled with the wet etchant (52) to a height of the wall (65). The reservoir (64) is filled with the wet etchant (52) to a height less than the height of the wall. A pump (66) coupled to the reservoir (64) pumps the wet etchant (52) through an osmotic membrane degasifier (69) to the tub (63). Adding the wet etchant (52) to the tub (63) causes the wet etchant (52) to cascade over the wall (65) back to the reservoir (64). The osmotic membrane degasifier (69) reduces a concentration of a reactive agent in the wet etchant (52).

13 Claims, 2 Drawing Sheets

METHOD FOR ETCHING A DIELECTRIC LAYER OVER A SEMICONDUCTOR SUBSTRATE

BACKGROUND OF THE INVENTION

The present invention relates, in general, to etching a semiconductor material and, more particularly, to wet etching a dielectric material on a semiconductor wafer.

Wet etching is widely used in semiconductor wafer processing for removing material from a semiconductor wafer. An example of a wet etch that is used extensively throughout the semiconductor industry is a Buffered Oxide Etch (BOE). BOE is used to etch a dielectric material such as phosphorus doped silicate glass (PSG). PSG is commonly used as a sacrificial layer to protect areas of a semiconductor wafer when forming semiconductor devices or micromachining sensor structures. PSG is also used to electrically isolate conductive regions over a semiconductor wafer from one another.

A typical wet etch process begins with a semiconductor wafer being dipped into a surfactant. The semiconductor wafer is then submerged into a recirculating bath of the etchant to etch a dielectric material. After etching, the semiconductor wafer is rinsed in deionized water and then dried in an isopropyl alcohol vapor. In some applications, e.g., in micromachining sensor applications, the semiconductor wafer is submerged in a hydrogen peroxide solution after it has been rinsed in the deionized water. Then, a second deionized water rinse is performed and the semiconductor wafer is dried in the isopropyl alcohol vapor. In general, the process of wet etching in the semiconductor industry has not significantly changed for many years.

Accordingly, it would be advantageous to have a process for etching a dielectric material over a semiconductor wafer which is highly selective and controllable. It would be of further advantage for the etching process to be simple and easily integrated into an existing etching process.

DETAILED DESCRIPTION OF THE DRAWINGS

Figure 1:
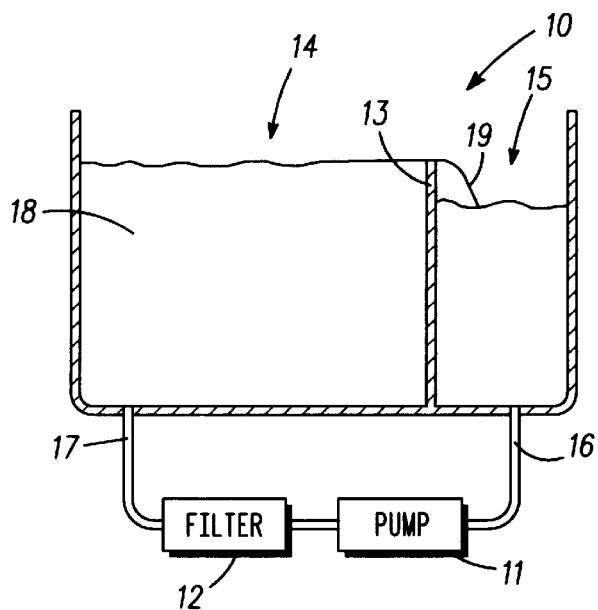
FIG. 1 is an illustration of a prior art wet etch bath.

Two reasons to improve a dielectric wet etch process are the constant reduction in feature size of the components that make up an integrated circuit and the long wet etch times associated with the formation of micromechanical structures on a semiconductor wafer. Theoretically, the wet etchant attacks only the dielectric material. However, in practice it has been found that conventional wet etch techniques produce overetching or reduce etch control, i.e., increase the variability from wafer lot to wafer lot.

Typically, unwanted dissolved gases are present in the wet etchant that produce an undesirable effect during the etch process. These unwanted gases are referred to as reactive agents. For example, a reactive agent reacts with exposed areas of a semiconductor substrate or an exposed material overlying the semiconductor substrate forming an unwanted layer on the exposed areas. Alternatively, the reactive agent could change the rate of etching. For example, slowing the rate of etching could increase wafer process cycle time which is an undesirable effect.

Two reactive agents found in a buffered oxide etchant are oxygen and ozone. A buffered oxide etchant is a dielectric wet etchant commonly used in semiconductor wafer processes. Buffered oxide etchants do not attack silicon or polysilicon but are very effective at etching silicon dioxide. The dissolved oxygen and ozone react with any exposed silicon or polysilicon on or over the wafer, forming silicon dioxide. The BOE then etches the newly formed silicon dioxide. The problem of forming silicon dioxide due to dissolved oxygen in the etchant is reduced by removing the oxygen (or ozone) from the wet etchant.

An example of a semiconductor wafer process that illustrates the problem of a reactive agent dissolved in a dielectric etchant is the process used in forming Complementary Metal Oxide Semiconductor (CMOS) transistors. High performance CMOS transistors have gate oxide thicknesses substantially less than 100 Angstroms (Å). Typically, the gate oxide thickness decreases as CMOS device geometries shrink. Ideally, the gate oxide thickness is uniform over the width and length of the transistor. Because the gate oxide conforms to the surface on which it is grown, aberrations in the surface or surface roughness of the semiconductor wafer will affect the operating characteristics of the transistors. For example, a high surface roughness can cause devices to fail or cause unwanted long term reliability issues.

Unprocessed semiconductors do not have a perfectly planar surface. Moreover, wafer processing steps have been found to further increase the non-planarity, i.e., the surface roughness, of the semiconductor. In particular, it is common for a semiconductor wafer surface to undergo at least one and sometimes several oxidation steps before a gate oxide is grown on it. Each oxidation step includes the steps of growing a silicon dioxide layer and removing the silicon dioxide layer with a dielectric wet etchant.

When removing a dielectric layer from a semiconductor surface, the surface becomes roughened because of oxygen and/or ozone present in the dielectric wet etchant. This occurs because portions of the semiconductor surface become exposed during the wet etch process, while other portions remain covered by the dielectric layer. The oxygen and/or ozone in the dielectric wet etchant oxidizes the exposed portions of the semiconductor wafer thereby forming silicon dioxide. It should be understood that the portions of semiconductor surface become exposed before other portions due to the dielectric layer being etched at a non-uniform etch rate, the dielectric layer having a non-uniform thickness, or a combination thereof. Silicon dioxide formed by the dissolved oxygen and ozone in the wet etchant is etched away by the wet etchant producing low areas where the surface is first exposed during the sacrificial oxide etch. The net result is an increase in surface roughness due to the wet etch. The roughness is exacerbated with an increase in the number of oxidation steps. As mentioned previously, an oxide, such as a gate oxide, grown on a rough surface of a semiconductor wafer will conform to the contour of the semiconductor surface. Thus, the transistor will not have a uniform planar sheet of gate oxide as expected nor will the operating characteristics of the device be predictable from a modeled device.

Empirical data taken from semiconductor wafers shows the significance of this problem. An unetched wafer characterized for surface roughness has a peak height measurement ($Z_{max}$) Of 0.88 nanometers and a standard deviation of the height variation of the semiconductor wafer of 0.078 nanometers. The standard deviation of the height variation on the semiconductor wafer is also referred to as the root mean square (RMS) of the height variation. When a semiconductor wafer is etched in a buffered oxide etchant for 85 seconds, it has a $Z_{max}$ of 1.58 nanometers and an RMS height variation of 0.18 nanometers. When a semiconductor wafer is etched in the buffered oxide etchant for 300 seconds, it has a $Z_{max}$ of 2.81 nanometers and an RMS height variation of 0.29 nanometers. When the semiconductor wafer is etched in the buffered oxide etchant for 900 seconds, it has a $Z_{max}$ of 3.24 nanometers and an RMS height variation of 0.41 nanometers. Thus, increasing the etch time increases surface roughness.

In general, the reactive agent in a wet etchant, e.g., oxygen and/or ozone, such as a buffered oxide etchant, should be removed or reduced in concentration to prevent surface roughening from occurring. Furthermore, the wet etch process should incorporate steps to prevent the reactive agent from reentering the process. The process is best disclosed by example. It should be understood that the process is not limited to the example but can be applied to different dielectric wet etchants with different reactive agents.

The Buffered Oxide Etch (BOE) process well known to one skilled in the art is commonly used for etching a dielectric material such as a sacrificial oxide layer from a substrate such as, for example, a semiconductor substrate. A typical sacrificial oxide layer used in the semiconductor industry is a phosphorus doped silicate glass, tetramethylphosphite doped glass, and the like. Typically, the substrate is dipped in a surfactant for a time period such as, for example, one minute. By way of example, the surfactant is a polyoxyalkylenealkylphenyl ether aqueous solution sold under trademark NCW 601A by Waco Chemical.

At least a portion of the substrate is submerged in a recirculating bath of an etchant such as, for example, a six to one (6:1) buffered oxide etchant consisting of six parts of ammonium fluoride and one part of hydrogen fluoride. The temperature of the etchant and the substrate submersion time determine the extent of the etching.

Recirculation of the etchant is established by overfilling the tub with the etchant. The portion of the etchant that overflows the tub is collected in a recirculating path, pumped through a filter, and injected back into the tub via injectors. It should be understood that the composition and the temperature of the etchant, and the length of the etching process can vary extensively depending on the process (for example forming semiconductor devices versus micromachining). These parameters can be adjusted to optimize each etching process. Any structure on the substrate (or the substrate itself) that reacts with oxygen dissolved in the etchant will form silicon dioxide and be etched by the etchant.

After etching, the semiconductor wafer is rinsed in a circulating bath of deionized water. The resistance during the rinse is monitored. Initially a low resistance is registered since the etchant is conductive. The conductivity decreases as the concentration of the etchant dissolved in the deionized water decreases. Typically, the rinse process is stopped after a certain resistance value is exceeded. Alternatively, the rinse could be a stopped after a predetermined time. In either method, the goal is to rinse the etchant and any particulates from the semiconductor wafer.

The problem of dissolved oxygen in the wet etchant starts at the factory where the etchant is made in large quantities. Chemical factories for etchants do not take any steps to reduce the oxygen or ozone in the etchant. Thus, the amount of oxygen and ozone dissolved in the wet etchant will vary with each manufacturer and from shipment to shipment. Typically, the etchant is shipped in bulk form, for example, by train to a semiconductor manufacturer. The etchant is then stored in the semiconductor plant in bulk form but in a vessel that is more mobile such as a 220 liter (55 gallon) drum. In a modern semiconductor facility, the etchant is plumbed to the etchant bath to add or refill the tubs as required.

FIG. 1 is an illustration of a wet etch bath 10 commonly used throughout the semiconductor industry. In general, wet etch equipment comprises wet etch bath 10, a pump 11, and a filter 12. Not shown is a heater/chiller unit to control the temperature of the wet etchant. Wet etch bath 10 is made of a material such as quartz or polytetrafluoroethylene which is impervious to the etchant. Wet etch bath 10 is designed for the removal of particles. In particular, wet etch bath 10 is designed to take advantage of the fact that the majority of particles generated during the wet etch process are found near the surface of the wet etchant.

Wet etch bath 10 has a wall 13 dividing wet etch bath 10 into a tub 14 and a reservoir 15. Reservoir 15 includes a drain 16 coupled to pump 11. Pump 11 pumps etchant 18 from reservoir 15 through filter 12 and back to tub 14 at an entry point 17. Filter 12 is coupled between pump 11 and tub 14 to filter out any particulates from the etchant retrieved from reservoir 15. Wall 13 separating tub 14 from reservoir 15 has a height less than the exterior wall height of wet etch bath 10. Tub 14 is filled with etchant 18 to the height of wall 13. Reservoir 15 is filled with etchant 18 to a height lower than that of wall 13. Wet etch bath 10 is designed such that etchant 18 cascades into reservoir 15 without splashing back into tub 14. Cascading of etchant 18 is indicated by the line identified by reference number 19. Etchant 18 is pumped from reservoir 15 to tub 14 causing etchant 18 to cascade over wall 13 back to reservoir 15. The volume of filtered etchant provided by pump 11 to tub 14 must be sufficient to carry particulates floating on the surface of etchant 18 in tub 14 to reservoir 15. Typically, etchant 18 is provided at the bottom of tub 14 to displace the etchant carrying particulates. Semiconductor wafers (not shown) are placed in a polytetrafluoroethylene wafer boat (not shown) that is submerged in etchant 18.

As mentioned previously, oxygen and/or ozone are dissolved in a wet etchant such as a buffered oxide etchant as delivered from the chemical supplier. Oxygen can also diffuse into the etchant through exposure of the etchant to the ambient. This is partially attributable to the fact that most wet etch baths do not have lids.

Figure 2:
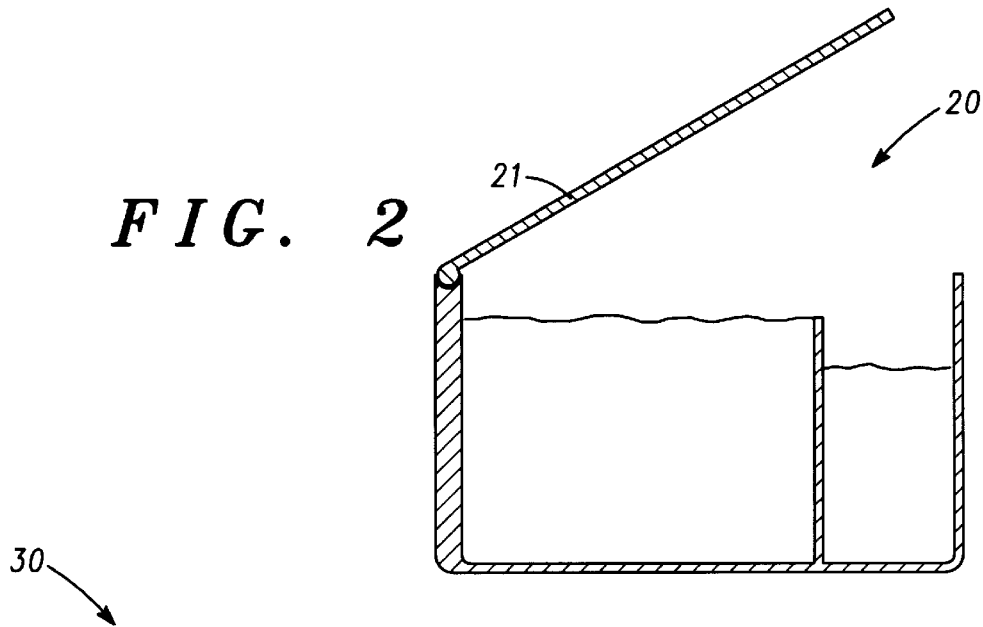
FIG. 2 is an illustration of a lid attached to a wet etch bath in accordance with one aspect of the present invention.

FIG. 2 is an illustration of a lid 21 attached to wet etch bath 20 in accordance with one aspect of the present invention. Lid 21 seals wet etch bath 20 from the ambient. A non-reactive (or inert) gas such as nitrogen is sprayed across the surface of the etchant to prevent oxygen diffusion into the etchant. It should be understood that when a non-reactive gas such as nitrogen is dissolved in the etchant, it does not affect the process of etching a dielectric.

Figure 3:
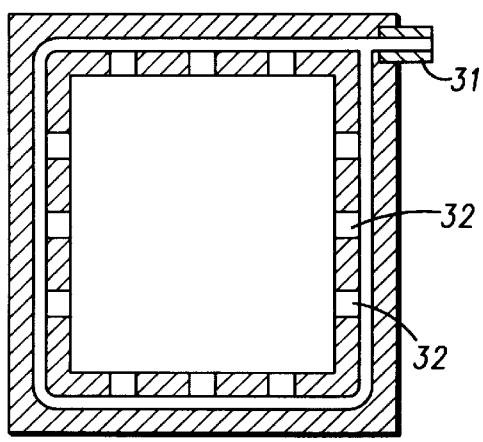
FIG. 3 is a top view of a wet etch bath illustrating a tube for spraying non-reactive gas over an etchant surface in accordance with another aspect of the present invention.

FIG. 3 is a top view of a wet etch bath 30 illustrating an example of a means for spraying non-reactive or an inert gas across the surface of the wet etchant in accordance with another aspect of the present invention. In the example, the spraying means is a tube 31 having openings 32. Tube 31 is placed around the periphery of wet etch bath 30. Openings 32 spray the non-reactive gas across the entire surface of the etchant to minimize contact with the ambient. Examples of non-reactive gases are nitrogen, carbon dioxide, helium, neon, argon, krypton, and xenon. These non-reactive gases will not react with the semiconductor or other materials on a semiconductor wafer should they become dissolved in the etchant.

Figure 4:
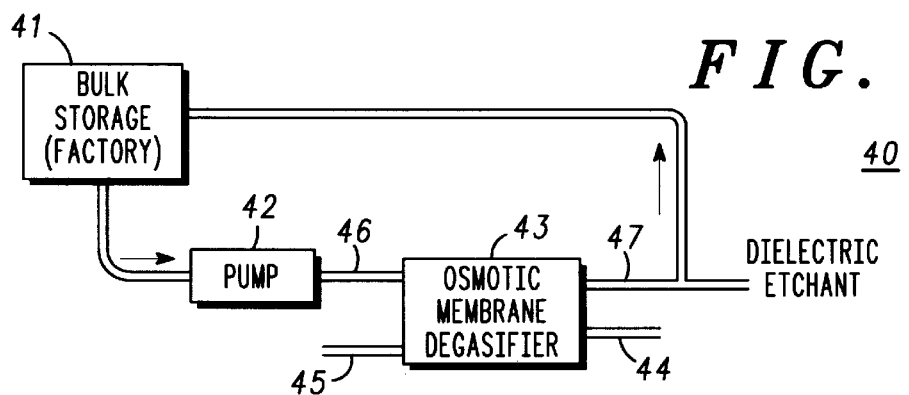
FIG. 4 is a diagram illustrating a system having an osmotic membrane degasifier for degasifying an etchant in accordance with the present invention.

FIG. 4 is a diagram illustrating a system 40 for degasifying an etchant in accordance with the present invention. In general, a wet etchant, such as a buffered oxide etchant, for etching a dielectric is stored in bulk form at the factory or in a semiconductor facility. Degasifying the etchant to remove an oxidizing gas or a dissolved gas, e.g., oxygen and ozone, at the chemical factory or bulk storage in the semiconductor facility eliminates or reduces the degasification time when filling or adding wet etchant to a wet etch bath. In principle, the wet etch bath could be used immediately for etching after being filled with the wet etchant because the reactive agent is removed.

In general, the etchant is degasified before being placed in bulk storage. Degasification is the process of reducing the amount of a reactive agent dissolved in a wet etchant. In one method, the wet etchant is degasified and placed in bulk storage. Levels of the reactive agent may not increase during bulk storage if it is not exposed to an ambient containing the reactive agent. Another method is to continually degasify the wet etchant in bulk storage to ensure that the levels of reactive agent are minimized. A bulk storage unit 41 stores an etchant. A pump 42 pumps the etchant through an osmotic membrane degasifier 43, which displaces a reactive agent with a non-reactive gas. For example, if the etchant may be a buffered oxide etchant, the reactive agent is oxygen and/or ozone and the non-reactive gas may be nitrogen. Other non-reactive gases or a vacuum could be used to remove or displace the oxygen from the buffered oxide etchant. Osmotic membrane degasifier 43 has a gas input port 44 for receiving the non-reactive gas and a gas output port 45 for exhausting non-reactive gas and the displaced gas from the etchant. Osmotic membrane degasifier 43 has a fluid input port 46 coupled to pump 42 for receiving an etchant and a fluid output port 47 for providing the degasified etchant back to bulk storage unit 41 or to a wet etch bath. The system in operation will cycle the etchant from bulk storage unit 41 through osmotic membrane degasifier 43 to reduce the concentration of a dissolved gas in the etchant.

Figure 5:
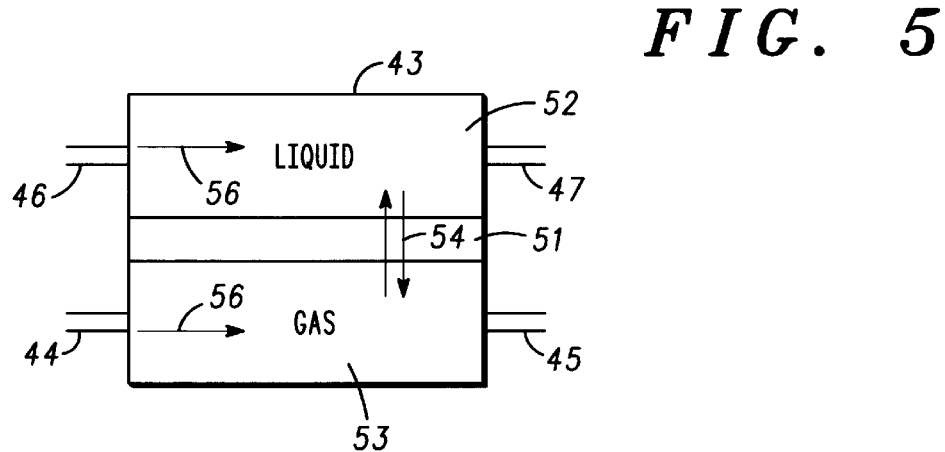
FIG. 5 is an illustration showing the operation of the osmotic membrane degasifier of FIG. 4.

FIG. 5 is an illustration showing how an osmotic membrane degasifier operates. A membrane 51 separates a liquid 52, such as a wet dielectric etchant, from a non-reactive gas 53. Membrane 51 is gas permeable but does not allow liquid 52 to penetrate to the side with gas 53. The arrows 54 perpendicular to membrane 51 indicate that gases can pass through membrane 51. Typically both liquid 52 and gas 53 flow across membrane 51. The arrows 56 parallel to membrane 51 indicate that liquid 52 and gas 53 flow along membrane 51. Liquid 52 is continually flowing past membrane 51 to purge liquid 52 of a dissolved gas. Gas 53 flows past membrane 51 to remove the mixture of gas and dissolved gas from the osmotic membrane degasifier.

The osmotic membrane degasifier works on the principle of diffusion. Areas of high concentrations of a gas diffuse to areas that have a low concentration of the gas. In the limit, the concentration of the gas will reach equilibrium throughout the volume. A simplified explanation of how the osmotic membrane degasifier functions is provided using buffered oxide etchant as liquid 52, an oxidizing gas such as oxygen and/or ozone as the dissolved gases, i.e., reactive agents, in buffered oxide etchant 52, and nitrogen as gas 53. Membrane 51 is not affected by the acid in buffered oxide etchant 52. For example, polypropylene and polytetrafluoroethylene are good materials for a membrane since they do not react with an acid such as those used in buffered oxide etchants. Other gases such as carbon dioxide, helium, neon, argon, krypton, and xenon can be used to displace the oxygen and/or ozone from the buffered oxide etchant. A vacuum is also an option for removing oxygen from the buffered oxide etchant. Buffered oxide etchant 52 is on a first side of membrane 51. Gaseous nitrogen 53 is on a second side of membrane 51. The concentration of oxygen/ozone is much higher on the first side of membrane 51 than on the second side. Thus, oxygen and/or ozone diffuse through membrane 51 to the second side where their concentrations are lower and the concentration of nitrogen gas 53 is higher. The process deoxygenates buffered oxide etchant 52 which reduces the concentration of oxygen and/or ozone therein. Similarly, the concentration of nitrogen gas 53 is higher on the second side than on the first side of membrane 51. Thus, nitrogen gas 53 diffuses through membrane 51 into the buffered oxide etchant on the first side of membrane 51 where the concentration of nitrogen gas is lower and the concentration of oxygen and/or ozone are higher. The oxygen and ozone, as well as some of nitrogen gas 53, on the second side of membrane 51 are exhausted from filter 43. It should be understood that nitrogen gas 53 is continually injected into the second side of membrane 51 to ensure that the concentration of nitrogen gas 53 is always greater on the second side of membrane 51.

An osmotic membrane degasifier capable of removing oxygen from dielectric etchants, such as a buffered oxide etchant, is made by the Hoechst Celanese Corporation See "Tough Under Pressure! Liqui-Cel®", AT&T Application Sheet, PC-P41-1/97-HC, 1997 Hoechst Celanese Corporation, which is hereby incorporated by reference. The membrane is made of polypropylene which is not affected by ammonium fluoride and hydrogen fluoride that are part of buffered oxide etchant 52. The osmotic membrane degasifier is sold as an extra-flow membrane contactor. The osmotic membrane degasifier sold by the Hoechst Celanese Corporation is commonly used in the food industry. For example, it is used for gasifying/degasifying soda and beer. Another application is for water treatment such as ultrafiltration, reverse osmosis, and ion exchange.

Figure 6:
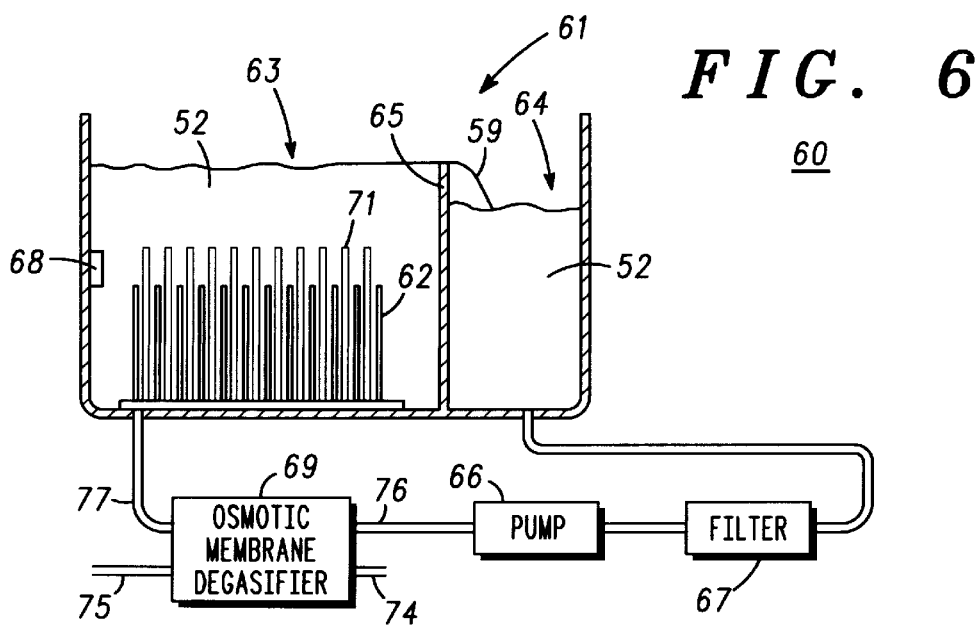
FIG. 6 is an illustration of an apparatus for etching a dielectric over a semiconductor in accordance with the present invention.

FIG. 6 is an illustration of an apparatus 60 for etching a dielectric over a semiconductor. It should be understood that the same reference numerals are used in the figures to denote the same elements. Apparatus 60 includes a wet etch bath 61, a heater/chiller unit (not shown) to control the temperature of a wet etchant (52), a pump 66, a filter 67, and an osmotic membrane degasifier 69. Wet etch bath 61 is filled with etchant 52 and is designed to hold a wafer carrier 62 carrying semiconductor wafers 71. Wet etch bath 61 has a lid and a gas purge (both not shown) for protecting etchant 52 from the ambient. The lid and gas purge were described respectively in FIG. 2 and FIG. 3. Wet etch bath 61 comprises a tub 63 and a reservoir 64. A wall 65 separates tub 63 from reservoir 64. Etchant 52 is filled in tub 63 up to a height of wall 65. Etchant 52 is filled to a level less than the height of wall 65 in reservoir 64.

A pump 66 pumps etchant from reservoir 64 to tub 63. Pump 66 typically provides etchant 52 to the bottom of tub 63. Most of the particles from the etched semiconductor wafers float to the surface of etchant 52 where they overflow into reservoir 64. A filter 67 is coupled to reservoir 64 and pump 66 to filter out particulates present in etchant 52. Osmotic membrane degasifier 69 is coupled to pump 66 and tub 63 to remove reactive agents from etchant 52. Osmotic membrane degasifier 69 has a gas input port 74 for receiving the non-reactive gas and a gas output port 75 for exhausting non-reactive gas and the displaced gas from etchant 52. Osmotic membrane degasifier 69 has a fluid input port 76 coupled to pump 66 for receiving etchant 52 and a fluid output port 77 for providing the degasified etchant 52 back to tub 63. A gas such as nitrogen, carbon dioxide, helium, neon, argon, krypton, and xenon is coupled to a gas input of osmotic membrane degasifier 69 to displace the reactive agents from etchant 52. Gas output port 75 is an outlet for removing the mixture of non-reactive gas and reactive agent purged from etchant 52. A vacuum can also be coupled to the gas ports of osmotic membrane degasifier 69 to remove the reactive agent in etchant 52. Purging is a process of reducing the concentration of the reactive agent in the wet etchant by either displacing the reactive agent with a non-reactive gas or by removing the oxygen from etchant 52 via diffusion to a vacuum resulting in a purged etchant. A sensor 68 in contact with the purged etchant in, for example, tub 63, senses the concentration of the reactive agent (oxygen and/or ozone). Sensor 68 determines when the concentration of the reactive agent in etchant 52 is low enough to proceed with the dielectric etching process.

Operation of wet etch bath 61 for etching a dielectric over the semiconductor includes recirculating wet etchant 52 from reservoir 64 to tub 63. The cycle time of the dielectric etch process is reduced by providing etchant 52 that is purged when filling or refilling tub 63 and reservoir 64. If a purged etchant is not provided, etchant 52 will have to be cycled through osmotic membrane degasifier 69 until the reactive agents are reduced to a level that is acceptable for the dielectric etching application. The amount of reactive agent present in etchant 52 is sensed by sensor 68.

Wafer carrier 62 is placed in tub 63 such that at least a portion of semiconductor wafers 71 are submerged in the purged etchant to etch the dielectric layer disposed thereover. The etchant is continually cycled through filter 67 and osmotic membrane degasifier 69 by pump 66 to respectively remove particulates and reactive agents dissolved in etchant 52. The rate at which the dielectric layer can be etched, i.e., the etch rate, can be changed by heating or cooling the purged etchant. The configuration of pump 66 with osmotic membrane degasifier 69 and filter 67 is not limited to the configuration shown in FIG. 6 but can be altered substantially depending on the components used and the dielectric etch requirements. Osmotic membrane degasifier 69 is a relatively inexpensive component that is easily retrofitted to existing wet etch bath systems. Osmotic membrane degasifier 69 significantly outperforms other prior art techniques, such as nitrogen bubbling, in removing a dissolved gas from the dielectric etchant. Osmotic membrane degasifier 69 will also have a long life within a semiconductor manufacturing environment because the membrane element does not react with the acids used in the dielectric etchant. The life expectancy of osmotic membrane degasifier 69 in a wet etch bath could be several years making it very cost effective while increasing device performance and yields.

For example, silicon dioxide is commonly used as a sacrificial layer or a dielectric layer to electrically isolate two conductive layers in a semiconductor device. As mentioned previously, the surface roughness on a semiconductor substrate occurs because a silicon dioxide sacrificial layer is etched using an etchant such as a buffered oxide etchant. Oxygen and/or ozone in the buffered oxide etchant forms silicon dioxide on any exposed regions of the semiconductor substrate, e.g., the surface, which is subsequently etched away by the buffered oxide etchant thereby producing a low spot. The net result is high and low areas on the semiconductor substrate (surface roughness). Removing the reactive agent, e.g., oxygen and/or ozone, from the buffered oxide etchant reduces or eliminates the formation of silicon dioxide. Buffered oxide etchant does not react with a semiconductor material such as silicon. Experiments clearly show the improvement in wet etching using osmotic membrane degasifier 69. Data from a non-etched wafer and a wafer etched in non-purged buffered oxide etchant have been disclosed hereinbefore. A sacrificial silicon dioxide layer etched with buffered oxide etchant for 900 seconds that has been purged with an osmotic membrane degasifier has a measured $Z_{max}$ of 1.16 nanometers and an RMS height variation of 0.071 nanometers. Alternatively, a sacrificial silicon dioxide layer etched with buffered oxide etchant for 900 seconds that is purged using nitrogen bubbling has a measured $Z_{max}$ of 1.90 nanometers and an RMS height variation of 0.19 nanometers. The use of an osmotic membrane degasifier significantly reduces surface roughness which is critical when forming thin gate oxides and submicron devices.

By now it should be appreciated that a method and apparatus for etching a dielectric layer over a semiconductor substrate have been provided. The wet etching process in accordance with the present invention protects the semiconductor substrate from being etched by reducing a reactive agent dissolved in the wet etchant. The process is simple and easy to implement by using an osmotic membrane degasifier to reduce the reactive gas in the etchant with a non-reactive gas or vacuum.

What is claimed is:

1. A method for etching a sacrificial silicon dioxide layer over a semiconductor substrate, comprising:

purging a buffered oxide etchant with a hydrophobic osmotic membrane degasifier that is corrosion resistant to said buffered oxide etchant, wherein said degasifier has a plurality of microporous hollow fibers knitted into an array that is wound around a distribution tube with a baffle, said purging said buffered oxide etchant with said hydrophobic osmotic membrane degasifier producing a purged etchant; and submerging a portion of said semiconductor substrate in said purged etchant to etch the sacrificial silicon dioxide layer over the semiconductor substrate.

2. The method of claim 1, wherein purging said buffered oxide etchant with said hydrophobic osmotic membrane degasifier includes displacing a dissolved gas in said buffered oxide etchant with a gas selected from the group consisting of nitrogen, carbon dioxide, helium, neon, argon, krypton and xenon.

3. The method of claim 1, wherein said plurality of microporous hollow fibers are microporous polypropylene hollow fibers.

4. A method for etching a sacrificial silicon dioxide layer on a semiconductor substrate to reduce surface roughness when the sacrificial silicon dioxide layer is removed, comprising:

displacing oxygen and ozone from a buffered oxide etchant with a hydrophobic osmotic membrane degasifier that is corrosion resistant to said buffered oxide etchant such that said buffered oxide etchant is deoxygenated, wherein said degasifier has a plurality of microporous hollow fibers knitted into an array that is wound around a distribution tube with a baffle; and submerging the semiconductor substrate in said buffered oxide etchant that has been deoxygenated to etch the sacrificial silicon dioxide layer.

5. The method of claim 4, wherein displacing oxygen and ozone from said buffered oxide etchant includes displacing oxygen and ozone with a gas selected from the group consisting of nitrogen, carbon dioxide, helium, neon, argon, krypton, and xenon to prevent the formation of silicon dioxide on the semiconductor substrate.

6. The method of claim 4, wherein said plurality of microporous hollow fibers are microporous polypropylene hollow fibers.

7. A method for etching a sacrificial silicon dioxide layer over a semiconductor wafer, comprising:

providing a buffered oxide etchant having a dissolved gas therein;

providing a hydrophobic osmotic membrane that is corrosion resistant to said buffered oxide etchant, wherein said hydrophobic osmotic membrane has a plurality of microporous hollow fibers knitted into an array that is wound around a distribution tube with a baffle and said hydrophobic osmotic membrane having a first side and a second side;

exposing said buffered oxide etchant to said first side of said hydrophobic osmotic membrane, wherein said buffered oxide etchant does not pass through said hydrophobic osmotic membrane;

exposing a gas to said second side of said hydrophobic osmotic membrane;

purging said buffered oxide etchant of said dissolved gas through osmosis to produce a purged etchant; and submerging the semiconductor wafer in said purged etchant to etch the sacrificial silicon dioxide layer.

8. The method of claim 7, further comprising filtering said buffered oxide etchant of particulates.

9. The method of claim 8, further comprising heating said purged etchant to change an etch rate.

10. The method of claim 8, further comprising cooling said purged etchant to change an etch rate.

11. The method of claim 7, further comprising preventing said purged etchant from being exposed to an ambient.

12. The method of claim 7, wherein exposing a gas to said second side of said hydrophobic osmotic membrane includes selecting said gas from the group consisting of nitrogen, carbon dioxide, helium, neon, argon, krypton, and xenon.

13. The method of claim 7, wherein said plurality of microporous hollow fibers are microporous polypropylene hollow fibers.

* * * * *